(12) United States Patent
Schuster

(10) Patent No.: US 8,023,104 B2
(45) Date of Patent: Sep. 20, 2011

(54) MICROLITHOGRAPHIC PROJECTION EXPOSURE APPARATUS

(75) Inventor: Karl-Heinz Schuster, Koenigsbronn (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 719 days.

(21) Appl. No.: 11/971,659

(22) Filed: Jan. 9, 2008

(65) Prior Publication Data

US 2008/0174759 A1    Jul. 24, 2008

(30) Foreign Application Priority Data

Jan. 22, 2007   (DE) .................. 10 2007 004 148

(51) Int. Cl.
*G03B 27/42* (2006.01)
(52) U.S. Cl. ............................ 355/53; 355/67
(58) Field of Classification Search ............. 355/30, 355/53, 67; 359/321–324, 250–252
See application file for complete search history.

(56) References Cited

U.S. PATENT DOCUMENTS

| 2,607,272 A | 8/1952 | Bond |
| 6,252,712 B1 | 6/2001 | Fuerter |
| 2004/0218271 A1 | 11/2004 | Hartmaier et al. |
| 2005/0146704 A1* | 7/2005 | Gruner et al. .............. 355/71 |
| 2006/0221453 A1* | 10/2006 | Koehler et al. ........... 359/619 |

FOREIGN PATENT DOCUMENTS

| DE | 103 12 003 A1 | 7/2004 |
| DE | 10 2005 060 517 A1 | 6/2007 |
| EP | 0 835 467 B1 | 11/2001 |
| WO | WO 2004/063777 A1 | 7/2004 |
| WO | WO 2005/054954 A2 | 6/2005 |
| WO | WO 2005/059645 A2 | 6/2005 |

* cited by examiner

*Primary Examiner* — Edward J Glick
*Assistant Examiner* — Mesfin T Asfaw
(74) *Attorney, Agent, or Firm* — Fish & Richardson P.C.

(57) ABSTRACT

Microlithographic projection exposure apparatuses, as well as related components, subsystems and methods are disclosed.

20 Claims, 9 Drawing Sheets

State of the art

State of the art a)

b)

State of the art a)

b)

d)

e)

f)

MICROLITHOGRAPHIC PROJECTION EXPOSURE APPARATUS

CROSS-REFERENCE TO RELATED APPLICATION

This application claims priority to German patent application serial number 10 2007 004 148.0-51, filed Jan. 22, 2007, which is hereby incorporated by reference.

FIELD

The disclosure relates to microlithographic projection exposure apparatuses, as well as related components, subsystems and methods.

BACKGROUND

Microlithography is used for the production of microstructured components such as for example integrated circuits or LCDs. The microlithography process is carried out in what is referred to as a projection exposure apparatus having an illumination system and a projection objective. The image of a mask illuminated via the illumination system (=reticle) is in that case projected via the projection objective on to a substrate (for example a silicon wafer) which is coated with a light-sensitive layer (photoresist) and arranged in the image plane of the projection objective to transfer the mask structure on to the light-sensitive coating of the substrate.

Retardation elements are frequently used both in the illumination system and also in the projection objective in order for example to afford defined polarisation distributions or to specifically manipulate polarisation distributions. Examples in that respect are for example the use of lambda/2-plates or the specific compensation of an unwanted disturbance in polarisation distribution, which is caused by the retardation in one or more lenses of intrinsically or naturally birefringent material. The term 'retardation' is used to denote the difference in the optical paths of two orthogonal (mutually perpendicular) polarisation states.

SUMMARY

In one aspect, the disclosure provides a microlithographic projection exposure apparatus that includes a birefringent retardation arrangement. The birefringent arrangement includes a retardation element, which, in turn, includes a first subelement and a second subelement. The first subelement includes an optically positively uniaxial crystal material which has a first optical crystal axis. The second subelement includes an optically negatively uniaxial crystal material which has a second optical crystal axis and which is arranged along an element axis of the retardation element before or after the first subelement. The first crystal axis and the second crystal axis are disposed in a plane perpendicular to an optical axis of the projection exposure apparatus. The first crystal axis and the second crystal axis are either arranged at an angle of of $0°\pm5°$ relative to each other or at an angle of $90\pm5°$ relative to each other.

In another aspect, the disclosure provides a birefringent retardation arrangement that includes a retardation element. The retardation element includes a first subelement and a second subelement. The first subelement includes an optically positively uniaxial crystal material which has a first optical crystal axis. The second subelement includes an optically negatively uniaxial crystal material which has a second optical crystal axis and which is arranged along an element axis of the retardation element before or after the first subelement. The first crystal axis and the second crystal axis are respectively disposed in a plane perpendicular to an optical axis of the arrangement. The first crystal axis and the second crystal axis are either arranged at an angle of $0°\pm5°$ relative to each other or at an angle of $90°\pm5°$ relative to each other. The first subelement and/or the second subelement have a thickness profile varying transversely with respect to the optical system axis.

In a further aspect, the disclosure provides a birefringent retardation arrangement that includes a retardation element. The retardation element includes a first subelement and a second subelement. The first subelement includes an optically positively uniaxial crystal material which has a first optical crystal axis. The second subelement includes an optically negatively uniaxial crystal material which has a second optical crystal axis and which is arranged along an element axis of the retardation element before or after the first subelement. The first crystal axis and the second crystal axis are respectively disposed in a plane perpendicular to an optical axis of the arrangement. The first crystal axis and the second crystal axis are either arranged at an angle of $0°\pm5°$ relative to each other or at an angle of $90°\pm5°$ relative to each other. The optically negatively uniaxial crystal material is sapphire ($Al_2O_3$) or lanthanum fluoride ($LaF_3$).

In an additional aspect, the disclosure features a birefringent retardation arrangement that includes a retardation element. The retardation element includes a first subelement and a second subelement. The first subelement includes an optically positively uniaxial crystal material which has a first optical crystal axis. The second subelement includes an optically negatively uniaxial crystal material which has a second optical crystal axis and which is arranged along an element axis of the retardation element before or after the first subelement. The first crystal axis and the second crystal axis are respectively disposed in a plane perpendicular to an optical axis of the arrangement. The first crystal axis and the second crystal axis are either arranged at an angle of $0°\pm5°$ relative to each other or at an angle of $90°\pm5°$ relative to each other. The optically positively uniaxial crystal material is magnesium fluoride ($MgF_2$).

In another aspect, the disclosure provides a microlithographic projection exposure apparatus that includes an illumination device and a projection objective. The illumination device and/or the projection objective comprises a retardation arrangement as set in the preceding paragraphs of the summary.

In a further aspect, the disclosure provides a process that includes using a projection exposure apparatus as described in the preceding paragraph to provide a microstructured component.

In some embodiments, the disclosure provides a microlithographic projection exposure apparatus with a birefingent retardation arrangement in which an unwanted variation in the retardation produced by the retardation arrangement in dependence on the angle of incidence or the propagation direction of the electromagnetic radiation can be reduced or avoided even when the retardation arrangement is of relatively large component thickness.

In certain embodiments, the disclosure provides microlithographic projection exposure apparatus including at least one birefringent retardation arrangement with at least one retardation element, wherein the retardation element includes:

a first subelement of optically positively uniaxial crystal material which has a first optical crystal axis; and a second subelement of optically negatively uniaxial crystal material which has a second optical crystal axis and which is arranged along an element axis of the retardation element before or after the first subelement;

wherein the first crystal axis and the second crystal axis are respectively disposed in a plane perpendicular to the optical system axis and are either arranged at an angle of 0°±5° relative to each other or at an angle of 90°±5° relative to each other.

The term optically positively uniaxial crystal material (also: birefringent material of optical positive character) is used herein to denote an optically uniaxial crystal material for which the extraordinary refractive index $n_e$ is greater than the ordinary refractive index $n_o$. In a corresponding fashion the term optically negatively uniaxial crystal material (also: birefringent material of optically negative character) is used to denote an optically uniaxial crystal material for which the extraordinary refractive index $n_e$ is less than the ordinary refractive index $n_o$.

The term element axis of the retardation element is used in the case of a rotationally symmetrical configuration of the retardation element, which is afforded in accordance with an embodiment of the disclosure, to denote the axis of symmetry thereof and moreover or generally that axis which in operation of the retardation element faces in the light propagation direction, along which therefore the retardation element is designed in regard to the retardation produced in that direction.

Optically positive materials which are particularly suitable and which are sufficiently transparent for typical working wavelengths of microlithography of less than 250 nm are for example crystalline quartz ($SiO_2$) and magnesium fluoride ($MgF_2$). Optically negative materials which are particularly suitable are for example sapphire ($Al_2O_3$) and lanthanum fluoride ($LaF_3$).

The disclosure is based, at least in part, on the realisation that the combination of optically uniaxial crystal materials of opposite optical character (that is to say the combination of optically positively uniaxial and optically negatively uniaxial crystal material) in the orientation of the respective optical crystal axes in those materials, as a consequence of the opposite effects which then occur, can afford a substantial reduction in the dependency of the retardation produced on the angle of incidence or the propagation direction of the electromagnetic radiation.

In that respect the effect of reducing the angle dependency of retardation can be achieved both with mutually perpendicular orientation of the optical crystal axes at both sides in the subelements and also in the case of mutually parallel orientation of those crystal axes. In accordance with the disclosure, in the case of mutually perpendicular orientation of the crystal axes, use is made of the fact that—as is also described in greater detail hereinafter—the retardation then can decrease continuously with a rising tilt angle α of the retardation arrangement in the one subelement thereof, whereas in the other subelement it continuously increases with a rising tilt angle α so that as a result a compensation effect is achieved in the sense of a lesser variation in the retardation in dependence on the tilt angle of the retardation arrangement.

In the case of the mutually parallel orientation of the crystal axes, the disclosure makes use of the fact that, by virtue of the different refractive indices of the two crystal materials of optically opposite character, when the retardation arrangement is tilted, the incident light beam still passes through the subelement involving a larger mean refractive index, at an angle which is smaller in relation to the perpendicular (that is to say in a position which 'comes still closer' to the perpendicular passage of light) than the subelement involving a smaller mean refractive index. Consequently, with increasing tilting of the retardation arrangement (or an increasing angle of incidence of the electromagnetic radiation on the retardation arrangement), the crystal material involving the smaller mean refractive index effectively exhibits a greater angle dependency, which in turn can be utilised in the sense of the desired compensation effect insofar as the greater retardation is set in the subelement including that crystal material of lower mean refractive index in comparison with the crystal material of greater mean refractive index, by virtue of a suitable choice of the component thickness at the two sides (that is to say for example a retardation in terms of magnitude of $1*\lambda$ in a subelement of quartz and a retardation in terms of magnitude of $1.5*\lambda$ in a subelement of sapphire, to achieve the overall retardation of $\lambda/2$ in the case of a lambda/2-plate). In conjunction with the optically opposite character of the two components that also makes it possible—as is also described in greater detail hereinafter—to achieve a compensation effect in the sense of a smaller variation in retardation in dependence on the tilt angle of the retardation arrangement, as far as a certain component thickness (more specifically, as long as the greater angle dependency in the more weakly refractive crystal material does not overcompensate for that in the more strongly refractive crystal material).

In some embodiments, systems and methods disclosed herein can provide the advantage that, as a consequence of the reduction in the variation in the retardation involved, in dependence on the angle of incidence or the propagation direction of the electromagnetic radiation in a retardation arrangement, it is also possible to use greater component thicknesses in respect of the subelements of optically uniaxial material (that is to say retardation elements of higher than zero order), with a still acceptable angle dependency in respect of the retardation, so that the problems of manufacturing technology which are linked to small component thicknesses are avoided.

The foregoing criteria 0°±5° and 90°±5° respectively express the point that certain deviations from parallel and perpendicular orientation respectively between the respective axes or directions are still also possible or are deemed to be embraced by the disclosure.

In some embodiments, the retardation element is of a rotationally symmetrical configuration relative to the element axis. In particular, the element axis may be identical with the optical system axis or may be parallel with the same, respectively.

In certain embodiments, the first subelement and/or the second subelement is of a thickness profile which varies transversely with respect to the optical system axis. As the formation of such a thickness profile is increasingly problematical with decreasing component thickness the greater component thickness of the subelements, which is made possible in accordance with the disclosure, with nonetheless a lower angle dependency in respect of the retardation produced, can be particularly advantageous here, as is explained in greater hereinafter.

The disclosure further provides a birefringent retardation arrangement including at least one retardation element, wherein the retardation element has:

a first subelement of optically positively uniaxial crystal material which has a first optical crystal axis; and a second subelement of optically negatively uniaxial crystal material which has a second optical crystal axis and which is arranged along an element axis of the retardation element before or after the first subelement;

wherein the first crystal axis and the second crystal axis are respectively disposed in a plane perpendicular to the optical system axis and are either arranged at an angle of 0°±5° relative to each other or at an angle of 90°±5° relative to each other; and wherein the first subelement and/or the second subelement have a thickness profile varying transversely with respect to the optical system axis.

In accordance with this aspect the combination of subelements of optically positive and optically negative crystal material with the selection of suitable orientations of the crystal axes is advantageously combined with the provision of at least one of those subelements involving a variable thickness profile. As that formation of such a thickness profile becomes more difficult from the manufacturing technology point of view with decreasing component thickness, the above-described concept for permitting even relatively large component thicknesses with adequate angle acceptance (that is to say with a low angle dependency in respect of the retardation afforded) can be particularly advantageous here. Thus a desired (for example aspherical) thickness profile can be incorporated into the respective subelement, using tried-and-tested technologies. In that respect, the desired, comparatively high level of angle acceptance is achieved in accordance with the disclosure in place of a reduction in thickness for example by removal of material by the addition of a subelement of optically opposite character.

The disclosure also provides a birefringent retardation arrangement including at least one retardation element, wherein the retardation element has:

a first subelement of optically positively uniaxial crystal material which has a first optical crystal axis; and a second subelement of optically negatively uniaxial crystal material which has a second optical crystal axis and which is arranged along an element axis of the retardation element before or after the first subelement;

wherein the first crystal axis and the second crystal axis are respectively disposed in a plane perpendicular to the optical system axis and are either arranged at an angle of 0°±5° relative to each other or at an angle of 90°±5° relative to each other; and wherein the optically negatively uniaxial crystal material is selected from the group which contains sapphire ($Al_2O_3$) and lanthanum fluoride ($LaF_3$).

In addition, the disclosure provides a birefringent retardation arrangement including at least one retardation element, wherein the retardation element has:

a first subelement of optically positively uniaxial crystal material which has a first optical crystal axis; and a second subelement of optically negatively uniaxial crystal material which has a second optical crystal axis and which is arranged along an element axis of the retardation element before or after the first subelement;

wherein the first crystal axis and the second crystal axis are respectively disposed in a plane perpendicular to the optical system axis and are either arranged at an angle of 0°±5° relative to each other or at an angle of 90°±5° relative to each other; and wherein the optically positively uniaxial crystal material contains magnesium fluoride ($MgF_2$).

The disclosure further concerns a process for the microlithographic production of microstructured components, and a microstructured component.

Further configurations of the disclosure are to be found in the description and the appendant claims.

BRIEF DESCRIPTION OF THE DRAWINGS

The disclosure is described in greater detail hereinafter via embodiments by way of example illustrated in the accompanying drawings in which.

DETAILED DESCRIPTION

Figure 1:
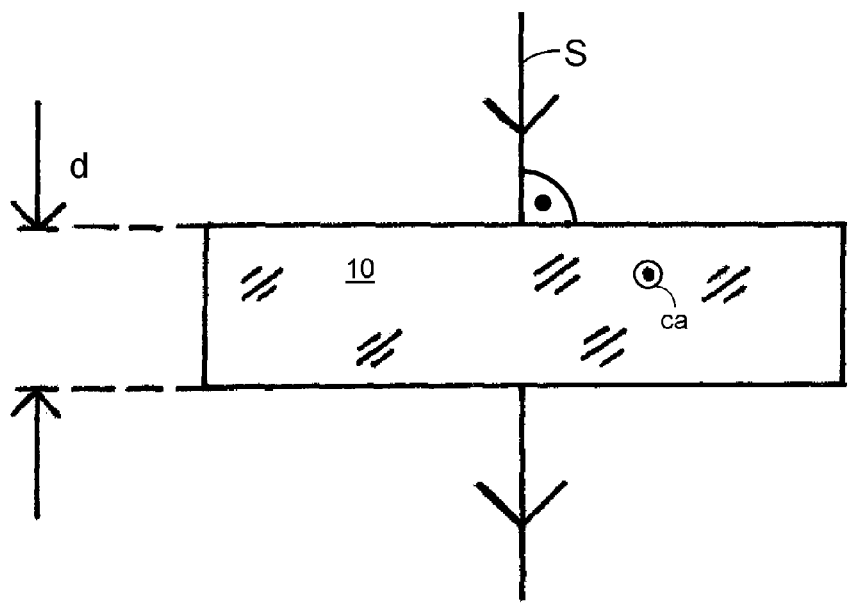
FIGS. 1 and 2 are each a diagrammatic view of a respective conventional birefringent retardation element with light passing therethrough perpendicularly (FIG. 1a and 2a) and inclinedly (FIG. 1b and 2b), FIG. 3 quantitatively shows the configuration of the retardation produced by the retardation element shown in FIG. 2 in dependence on a tilt angle and an azimuth angle (each defined hereinafter) of the retardation element and the optical crystal axis respectively.
Figure 1:
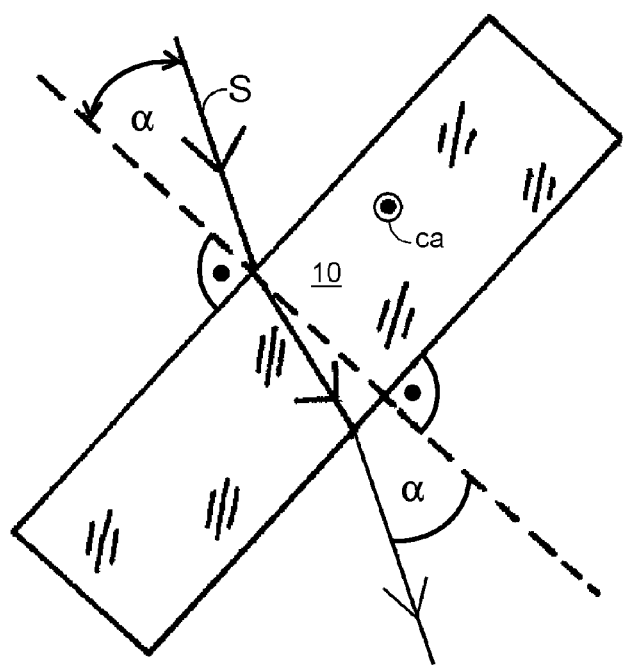

FIG. 1a-b and FIGS. 2a-b are used to describe the dependency, occurring for a retardation element in the form of a plane-parallel plate 10 of optically uniaxial crystal material such as for example crystalline quartz, in respect of the retardation produced, on the tilt angle of that plane-parallel plate relative to the direction of the incident light beam S. In that respect the optical crystal axis ca of the optically uniaxial crystal material is in the plane of the plane-parallel plate 10 both in FIG. 1a-b and also in FIG. 2a-b.

FIG. 1a-b considers a situation in which the plate 10, starting from the position with perpendicular light incidence (FIG. 1a), is tilted through an angle α in such a way (FIG. 1b) that that tilt occurs in a plane perpendicular to the optical crystal axis ca, that is to say about an axis of rotation oriented parallel to the optical crystal axis ca. That tilt is also referred to hereinafter as situation 1.

In that case the retardation identified hereinafter by $\phi_s$ is given by:

$$\Phi_s = d \cdot \left[ n_e \cdot \sqrt{1 - \frac{\sin^2 \alpha}{n_e^2}} - n_o \cdot \sqrt{1 - \frac{\sin^2 \alpha}{n_o^2}} \right] \quad (1)$$

In that case the refractive index difference $n_e - n_o$ remains constant with a varying tilt angle α, wherein, with a rising tilt angle α, the geometrical distance covered by the light beam S in the plate 10 and thus also the resulting retardation increases.

FIG. 2a-b considers a situation in which the plate 10, starting from the position involving perpendicular light incidence (FIG. 2a) is tilted through an angle α in such a way that the tilt occurs in a plane parallel or coplanar with the optical crystal axis ca, that is to say about an axis of rotation which is oriented perpendicularly with respect to the optical crystal axis ca. That tilt is also referred to hereinafter as situation 2.

In that case the retardation identified hereinafter by $\phi_p$ is given by:

$$\Phi_p = d \cdot (n_e - n_o) \cdot \sqrt{1 - \frac{\sin^2\alpha}{n_o^2}} \quad (2)$$

In that situation, with an increasing tilt angle, the refractive index difference $n_e - n_o$ continuously decreases, wherein the geometrical distance covered by the light beam S in the plate increases. As however the last-mentioned effect means that the reduction in the refractive index difference with increasing tilt angle $\alpha$ is not completely compensated the retardation which occurs overall having regard to both effects decreases continuously, with an increasing tilt angle $\alpha$.

For the general situation where the plate 10, starting from the position involving perpendicular light incidence (FIG. 1a, FIG. 2a) is tilted through an angle $\alpha$ in such a way that the tilt does not occur either in a plane parallel to the optical crystal axis ca or in a plane perpendicular thereto, the retardation identified by $\phi$ is given by:

$$\Phi = d \cdot \left[ n_e \cdot \sqrt{1 - \sin^2\alpha \cdot \left( \frac{\sin\theta}{n_e^2} + \frac{\cos^2\theta}{n_o^2} \right)} - n_o \cdot \sqrt{1 - \frac{\sin^2\alpha}{n_o^2}} \right] \quad (3)$$

wherein $\alpha$ denotes the tilt angle and $\theta$ denotes the azimuth angle of the orientation of the crystal axis, which is related to a predetermined reference axis (for example the x-axis) disposed in the plane (x-y-plane) perpendicular to the light propagation direction or to the optical system axis OA (z-axis).

In that respect a value of the azimuth angle $\theta=0$ corresponds to situation 1 shown in FIG. 1b, in which therefore the tilt occurs in a plane perpendicular to the optical crystal axis ca. In accordance with the only diagrammatic graphic representation in FIG. 3, between the two extremes of the tilt as shown in FIG. 1a-b and the tilt as shown in FIG. 2a-b there exists a tilt direction (that is to say an azimuth angle in respect of tilt) in which the retardation $\phi$ remains constant in relation to a variation in the tilt angle $\alpha$. The present disclosure puts that effect to use, as is described in greater detail hereinafter.

Tables 1a and 1b show the variation, arising out of foregoing equation (3), in retardation with a varying tilt angle $\alpha$ for a lambda/2-plate of crystalline quartz ($n_o \approx 1.660455$, $n_e \approx 1.673963$), at a working wavelength of $\lambda \approx 193.304$ nm, wherein Table 1a applies for a zero-order lambda/2-plate (that is to say the retardation caused by the plate is precisely $\lambda/2$, corresponding to a plate thickness of about 7.1552 μm) and Table 1b applies to a first-order plate (that is to say the retardation produced by the plate, with perpendicular passage of light therethrough, is precisely $\lambda + \lambda/2$, corresponding to a plate thickness of about 21.4655 μm):

TABLE 1a

| Tilt angle $\alpha$ [°] | Retardation [nm] situation 1 | Retardation [nm] situation 2 |
| --- | --- | --- |
| 0 | 96.652 | 96.652 |
| 20 | 94.58 | 98.75 |
| 30 | 92.17 | 101.32 |
| 40 | 89.12 | 104.75 |

TABLE 1b

| Tilt angle $\alpha$ [°] | Retardation [nm] situation 1 | Retardation [nm] situation 2 |
| --- | --- | --- |
| 0 | 96.652 | 96.652 |
| 20 | 90.43 | 102.95 |
| 30 | 83.19 | 110.64 |
| 40 | 74.04 | 120.95 |

The retardation thus varies both in dependence on the tilt direction and also in dependence on the tilt angle in a quite large range, namely with the above-specified tilt angle values by up to about 25%.

Figure 4:
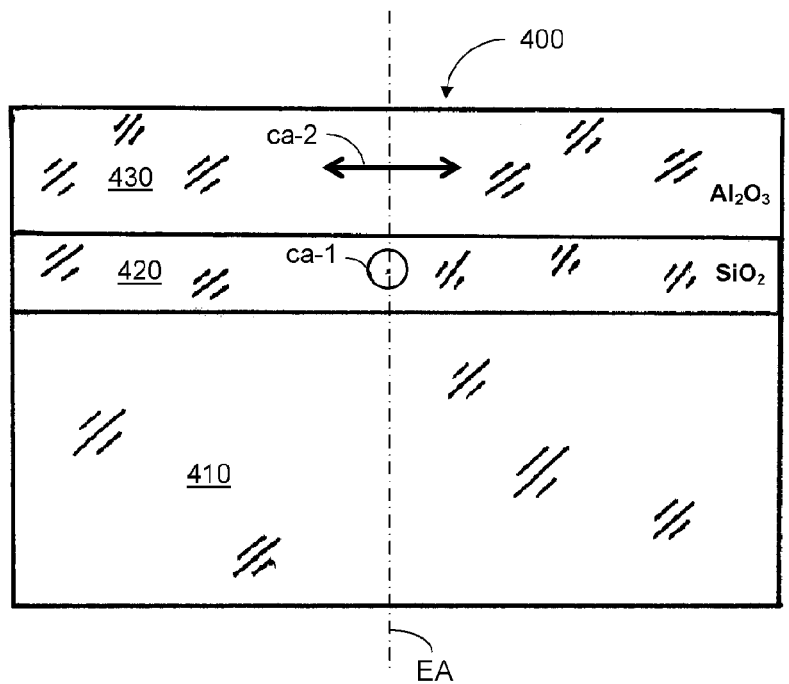
FIGS. 4 and 5 show diagrammatic views of retardation arrangements.

To overcome the above-described problem FIG. 4 shows the structure in principle of a birefringent retardation arrangement, wherein a lambda/2-plate is embodied by the retardation arrangement 400.

The retardation arrangement 400 includes, on a carrier 410 of optically isotropic quartz glass, a first retardation element 420 in the form of a plane-plate of optically positive, uniaxially birefringent crystal material (that is to say $n_e - n_o > 0$) and on that first retardation element 420 a second retardation element 430 in the form of a further plane-plate of optically negative, uniaxially birefringent crystal material (that is to say $n_e - n_o < 0$), wherein those retardation elements are arranged in succession along an element axis EA and (without the disclosure being restricted thereto) are in direct contact with each other in accordance with the illustrated embodiment. The optical crystal axes in the first and second retardation elements 420, 430 respectively are denoted by ca-1 and ca-2. The orientations of those two crystal axes ca-1 and ca-2 are each disposed in the plane of the plate and cross each other at an angle of 90°. Optically positive materials which are particularly suitable are crystalline quartz ($SiO_2$) and magnesium fluoride ($MgF_2$). Optically negative materials which are particularly suitable are sapphire ($Al_2O_3$) and lanthanum fluoride ($LaF_3$). The precise data for the first embodiment of the structure shown in FIG. 4 are specified in Table 2:

TABLE 2

| | 1st retardation element (420) | 2nd retardation element (430) |
| --- | --- | --- |
| Material | Quartz ($SiO_2$) | Sapphire ($Al_2O_3$) |
| Thickness [μm] | 3.050 | 4.888 |
| Refractive index $n_o$ | 1.660455 | 1.928032 |
| Refractive index $n_e$ | 1.673963 | 1.916686 |

Table 3 sets out the values of retardation for the embodiment of Table 1 in angle-dependent relationship, more specifically both for the above-defined situation 1 and also for the above-defined situation 2.

TABLE 3

| Tilt angle $\alpha$ [°] | Retardation [nm] situation 1 | Retardation [nm] situation 2 |
| --- | --- | --- |
| 0 | 96.659 | 96.659 |
| 10 | 96.660 | 96.659 |
| 20 | 96.674 | 96.674 |
| 30 | 96.723 | 96.749 |
| 40 | 96.834 | 96.938 |

As can be seen from Table 3 in the embodiment of FIG. 4 and Table 2 the retardation varies both in dependence on the tilt direction (or the azimuth angle $\theta$) and also in dependence on the tilt angle in comparison with the situation described with reference to FIGS. 1 and 2, only to a very slight degree, more specifically with the above-specified tilt angle values only by up to about 0.28%, in which respect even for the tilt angle α=20° the difference between situation 1 and situation 2 is reduced to zero.

Consequently the thicknesses of the retardation elements 420 and 430 can also be increased beyond the respective thicknesses of the so-called zero-order elements, in which respect moreover acceptable variations in retardation are observed in dependence on the tilt direction and the tilt angle, as will be seen from Table 5 which, similarly to Table 3, presents the values of retardation for a first-order plate (that is to say the retardation produced by the retardation arrangement is precisely $\lambda/2+\lambda$ with light passing perpendicularly through the arrangement), with the precise data of that arrangement being shown in Table 4.

TABLE 4

| Total retardation $\lambda/2 + \lambda$ | 1st retardation element | 2nd retardation element |
|---|---|---|
| Material | Quartz (SiO$_2$) | Sapphire (Al$_2$O$_3$) |
| Thickness [μm] | 9.149 | 14.663 |

TABLE 5

| Tilt angle α [°] | Retardation [nm] situation 1 | Retardation [nm] situation 2 |
|---|---|---|
| 0 | 96.647 | 96.647 |
| 10 | 96.652 | 96.647 |
| 20 | 96.694 | 96.694 |
| 30 | 96.841 | 96.919 |
| 40 | 97.170 | 97.484 |

The variation in retardation both in dependence on the tilt direction and also in dependence on the tilt angle is also very slight for this first-order retardation arrangement in comparison with the situation described with reference to FIGS. 1 and 2, and is at a maximum 0.86% with the above-specified tilt angle values.

Tables 6 and 7 similarly also show for a medium angle range (up to tilt angles of 20°) a further embodiment of a tenth-order retardation arrangement (that is to say the retardation produced by the retardation arrangement with light passing perpendicularly therethrough is precisely $\lambda/2+10*\lambda/2$).

TABLE 6

| Total retardation $\lambda/2 + 10 * \lambda$ | 1st retardation element | 2nd retardation element |
|---|---|---|
| Material | Quartz (SiO$_2$) | Sapphire (Al$_2$O$_3$) |
| Thickness [μm] | 64.044 | 102.642 |

TABLE 7

| Tilt angle α [°] | Retardation [nm] situation 1 | Retardation [nm] situation 2 |
|---|---|---|
| 0 | 96.642 | 96.642 |
| 5 | 96.649 | 96.637 |
| 10 | 96.679 | 96.641 |
| 15 | 96.769 | 96.719 |
| 20 | 96.973 | 96.972 |

The variation in retardation both in dependence on the tilt direction and also in dependence on the tilt angle is still very slight for this medium angle range in comparison with the situation described with reference to FIGS. 1 and 2, and is at a maximum 0.34% with the above-specified tilt angle values.

Figure 2:
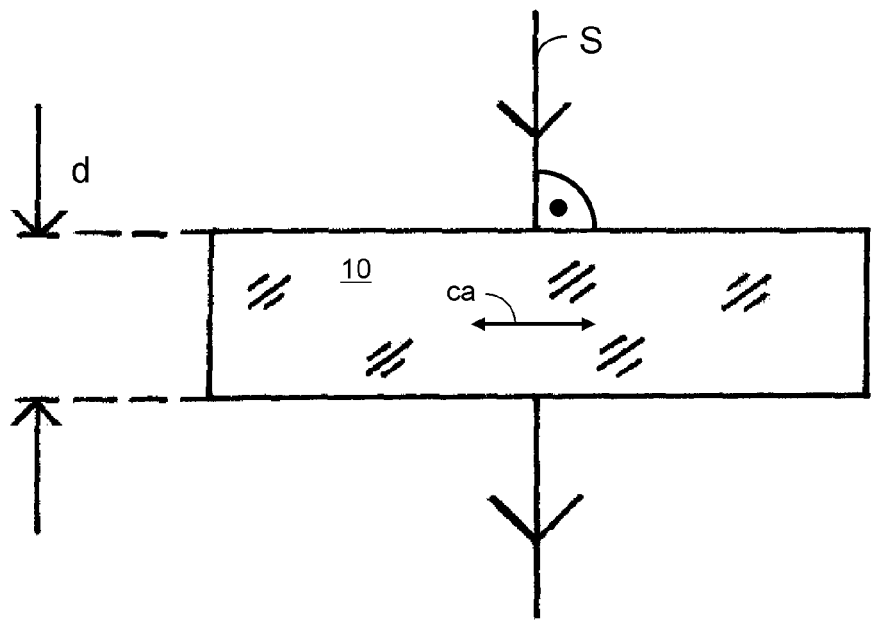
Figure 2:
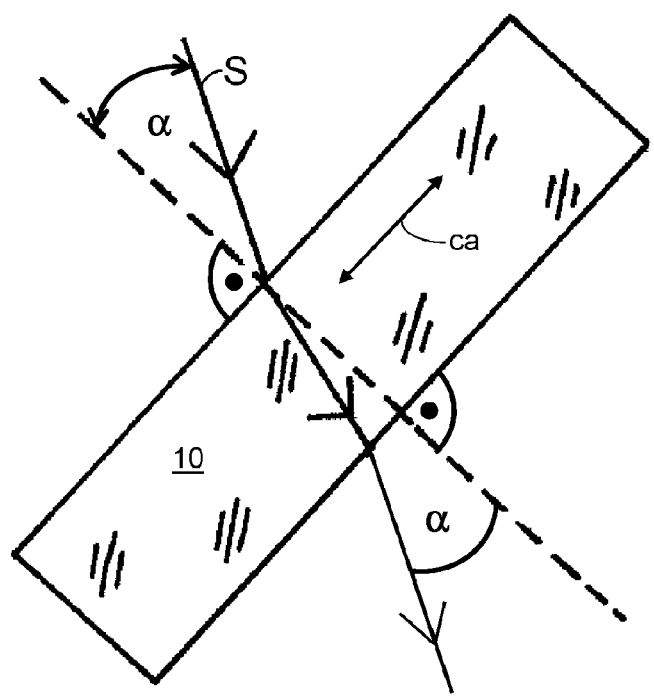
Figure 3:
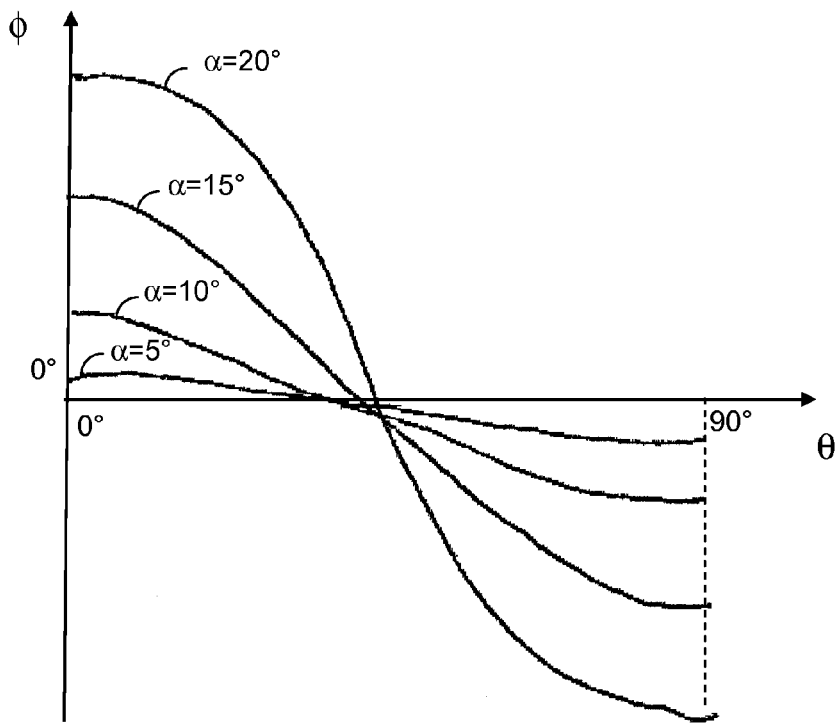

Overall the above-described embodiments show that, for the higher-order retardation arrangements, the variation in retardation with the tilt angle and the tilt direction is substantially less than the corresponding variations with a conventional retardation arrangement consisting of an individual plate as shown in FIG. 1 and FIG. 2.

A further increase in the order of the retardation arrangement leads to increasing temperature sensitivity (that is to say an increasing variation in retardation with a change in temperature), wherein for example for the foregoing example of a tenth-order retardation arrangement the temperature-dependent variation in retardation is about 0.4 nm with a temperature change by 1° C. If the relatively good temperature controllability of a projection objective for lithography is taken into consideration, a good compromise is attained for example for an order K=5 (that is to say the retardation produced by the arrangement is precisely $\lambda/2+5*\lambda/2$ with light passing perpendicularly therethrough), as between manufacture which involves as few problems as possible, on the one hand, and a still low temperature dependency in respect of retardation (with a temperature change by 1° C., about 0.12-0.24 nm), on the other hand, in which respect the variation of the tilt direction can be reduced to zero in particular also for a freely selectable angle.

Figure 5:
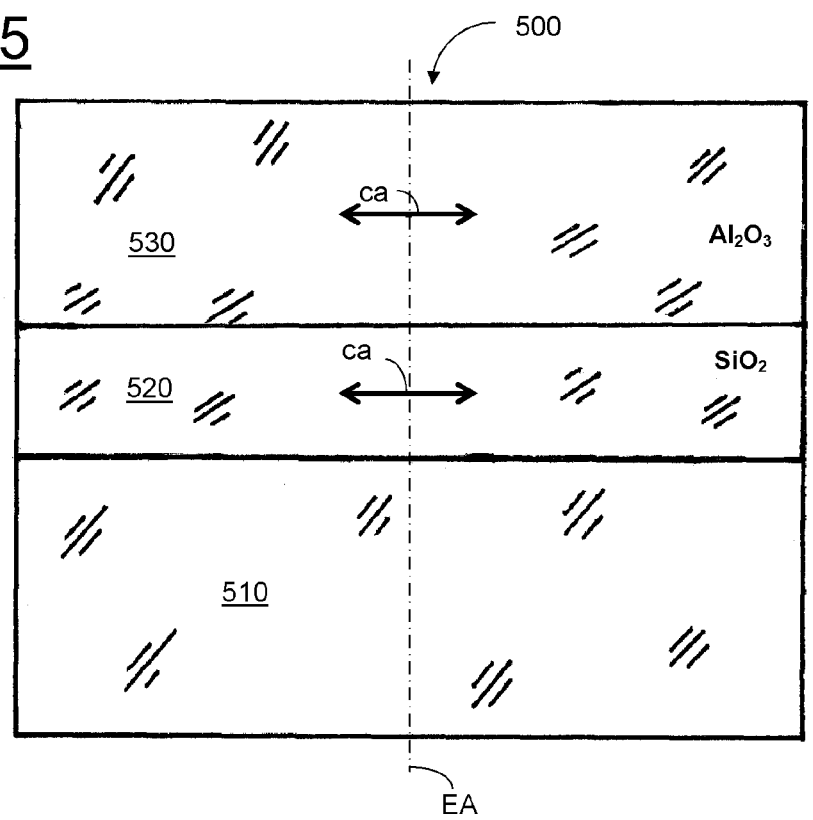

FIG. 5 shows the structure in principle of a birefringent retardation arrangement 500 in accordance with a further embodiment of the disclosure, a lambda/2-plate in turn being embodied by the retardation arrangement 500.

The retardation arrangement 500 again includes on a carrier 510 of optically isotropic quartz glass, a first retardation element 520 in the form of a plane-plate of optically positive, uniaxially birefringent crystal material (that is to say $n_e-n_o>0$) and, on that first retardation element 520, a second retardation element 530 in the form of a further plane-plate of optically negative, uniaxially birefringent crystal material (that is to say $n_e-n_o<0$). The optical crystal axes in the first and second retardation elements 520, 530 are respectively identified by ca-1 and ca-2. The orientations of those optical crystal axes ca-1 and ca-2 are each disposed in the plane of the plate and are oriented in mutually parallel relationship. Suitable optically positively uniaxial materials are again crystalline quartz (SiO$_2$) and magnesium fluoride (MgF$_2$). Suitable optically negative uniaxial materials are again sapphire (Al$_2$O$_3$) and lanthanum fluoride (LaF$_3$). The precise data for the embodiment involving the structure shown in FIG. 5 are specified in Table 8:

TABLE 8

| | 1st retardation element | 2nd retardation element |
|---|---|---|
| Material | Quartz (SiO$_2$) | Sapphire (Al$_2$O$_3$) |
| Thickness [μm] | 14.310 | 25.556 |

TABLE 9

| Tilt angle α [°] | Retardation [nm] situation 1 | Retardation [nm] situation 2 |
|---|---|---|
| 0 | 96.652 | 96.652 |
| 20 | 96.198 | 97.152 |

TABLE 9-continued

| Tilt angle α [°] | Retardation [nm] situation 1 | Retardation [nm] situation 2 |
|---|---|---|
| 30 | 95.704 | 97.660 |
| 40 | 95.135 | 98.164 |

The variation in retardation both in dependence on the tilt direction and also in dependence on the tilt angle is also very slight in comparison with the situation described with reference to FIGS. 1 and 2, and is at a maximum 1.56% with the above-specified tilt angle values.

In the embodiment shown in FIG. 5 and Tables 8 and 9 the (mean) refractive index of the quartz crystal, which is lower in comparison with sapphire, is put to use, which in that respect leads to a greater dependency in respect of retardation on the tilt angle, than for example with a tilt angle of 20°, the incident light beam passes through the subelement of sapphire at an angle which is smaller in relation to the perpendicular (that is to say in a position which 'comes still closer' to the perpendicular passage of light therethrough) than the subelement of quartz.

By virtue of a suitable choice in the component thicknesses on the two sides, the greater retardation is set in the subelement with the greater mean refractive index (that is to say for example a retardation in terms of magnitude of 1*λ in the subelement of quartz and a retardation in terms of magnitude of 1.5*λ in the subelement of sapphire). In conjunction with the optically opposite character of the two components a compensation effect can then be achieved in the sense of a smaller variation in the retardation of the overall arrangement in dependence on the tilt angle of the retardation arrangement 500.

The compensation principle applied in the embodiment of FIG. 5 in regard to angle dependency of retardation, that is to say with parallel orientation of the optical crystal axes in the subelements, is however restricted to the selected thicknesses of those subelements as, with an increasing thickness, the angle dependency of the quartz crystal overcompensates for that of the sapphire. Now the thicknesses of the two subelements can be so selected that the greater retardation is produced in the subelement involving the higher refractive index, in which case it is possible to reduce to zero the difference between the two extreme tilt directions (that is to say the above-defined situations 1 and 2) for a given tilt angle, as can be seen from the example hereinafter of Tables 10 and 11 for the tilt angle α=40°. In contrast Table 12 shows that, for retardation arrangements including two subelements of optically opposite character and with an overall effect as a lambda/2-plate, with increasing retardation in respect of the individual subelements above the values optimised for the tilt angle of 40°, the difference between the retardation in situation 1 and the retardation in situation 2 becomes continuously greater.

TABLE 10

|  | 1st retardation element | 2nd retardation element |
|---|---|---|
| Material | Quartz (SiO₂) | Sapphire (Al₂O₃) |
| Thickness [µm] | 18.696 | 30.778 |
| Retardation [λ] | 1.3065 | 1.8065 |

TABLE 11

| Tilt angle α [°] | Retardation [nm] situation 1 | Retardation [nm] situation 2 |
|---|---|---|
| 0 | 96.652 | 96.652 |
| 20 | 96.568 | 96.768 |
| 30 | 96.554 | 96.782 |
| 40 | 96.581 | 96.581 |

TABLE 12

| Retardation 1st subelement (quartz) [λ] | Retardation 2nd subelement (sapphire) [λ] | Total retardation situation 1 [nm] | Total retardation situation 2 [nm] |
|---|---|---|---|
| 0 | 0.5 | 91.122 | 102.555 |
| 1 | 1.5 | 95.135 | 98.164 |
| 1.3065 | 1.8065 | 96.581 | 96.581 |
| 1.5 | 2.0 | 97.141 | 95.969 |
| 3.0 | 3.5 | 103.160 | 89.382 |
| 5.0 | 5.5 | 111.185 | 80.600 |
| 10.0 | 10.5 | 131.248 | 58.644 |
| 20.0 | 20.5 | 171.373 | 14.734 |
| 23.355 | 23.855 | 184.834 | 0.002 |

Figure 6:
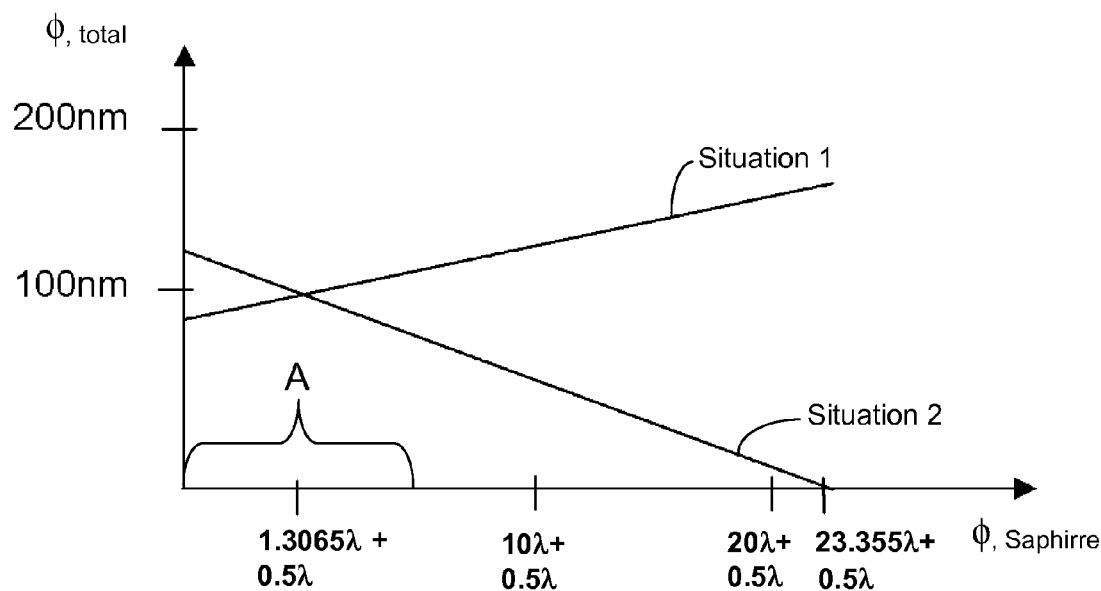
FIG. 6 shows a diagram for the retardation arrangement shown in FIG. 5 and for a predetermined tilt angle to show the dependency of the total retardation on the order K of the retardation arrangement and the tilt angle of that retardation arrangement.

The difference between the total retardations for situation 1 and situation 2, which increases with increasing thickness of the individual subelements of the retardation arrangement, is also shown in the graph in FIG. 6, wherein the range A as far as a retardation in respect of the subelement 530 of sapphire of 5*λ+0.5 λ (corresponding to a retardation on the part of the subelement 520 of quartz of 5*λ) is marked and again represents a good compromise between manufacture which involves as few problems as possible on the one hand and a still acceptable variation in retardation with the tilt direction and the tilt angle on the other hand, as well as a still low level of temperature dependency.

Figure 7:
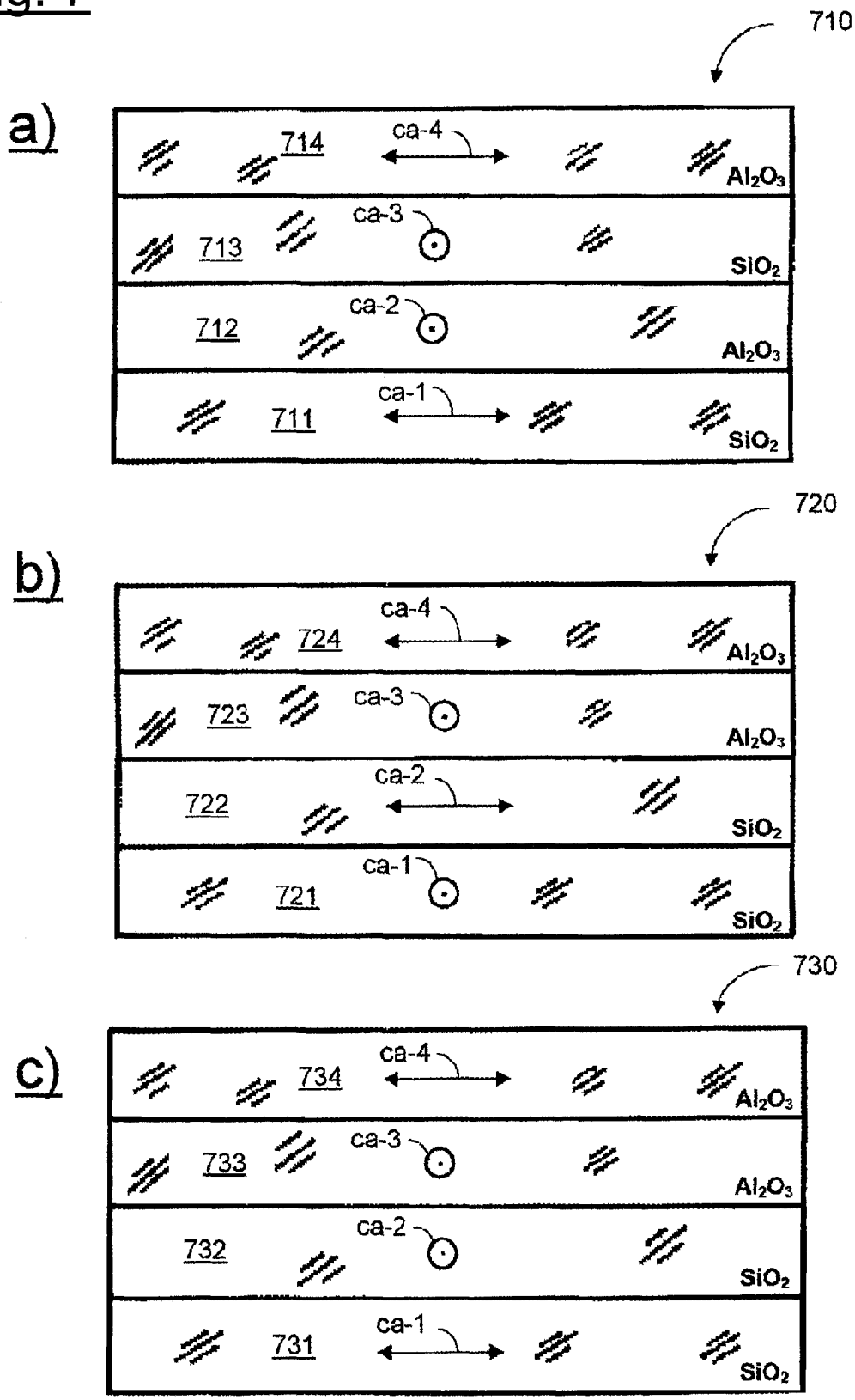
FIGS. 7a-f show diagrammatic views of a retardation arrangement each having four subelements, FIGS. 8-10 each show retardation arrangements composed of subelements of varying thickness profile.
Figure 7:
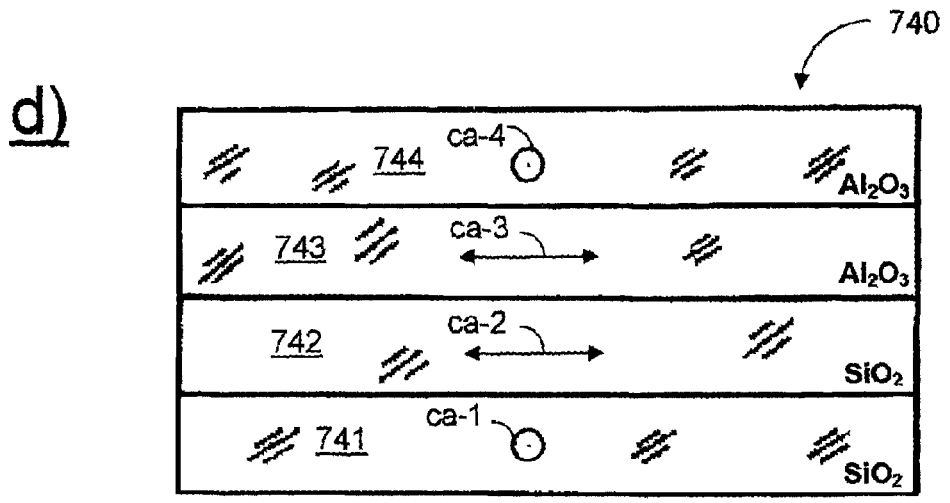
Figure 7:
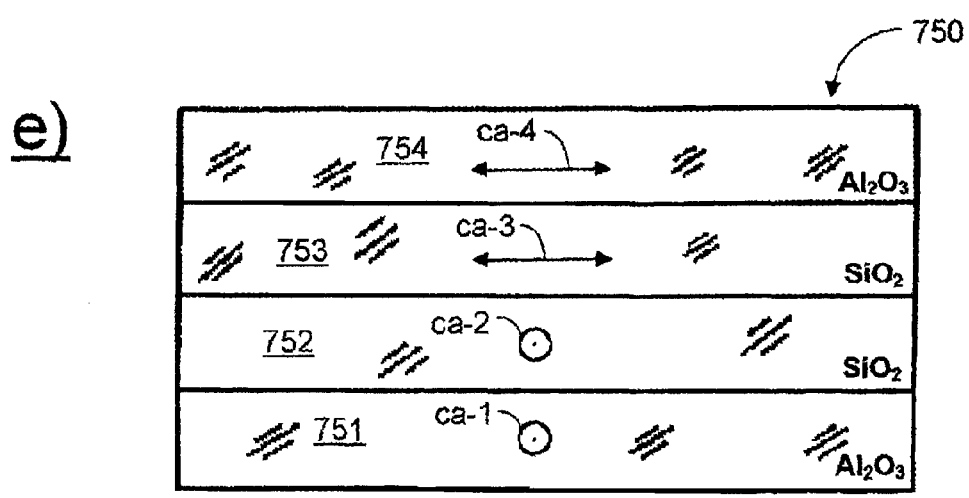
Figure 7:
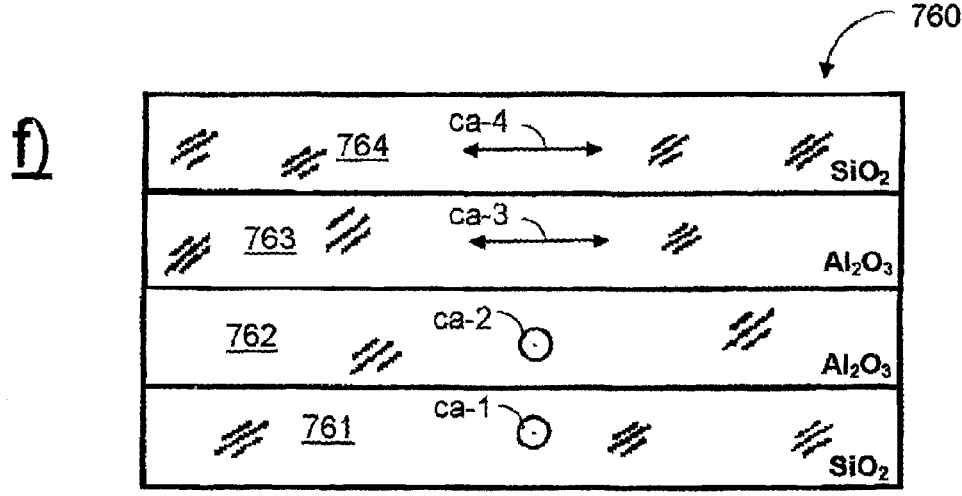

Reference will be made to FIG. 7 to describe hereinafter further embodiments of retardation arrangements which are composed of more than two individual subelements (four thereof in the illustrated embodiments). Each of those embodiments has a first pair and a second pair of subelements which are each in the form of plane-plates, including optically uniaxial crystal materials of opposite optical character, wherein the optical crystal axes of the subelements associated with one pair are respectively oriented in the plane of the plate and in mutually perpendicular relationship. In that case the thicknesses of the subelements of the first pair are so selected that the retardation produced by those subelements jointly is an integral multiple of the working wavelength (for example 5*λ), that is to say form an 'empty plate' (that is to say a plate which is polarisation-neutral with light passing perpendicularly therethrough) of higher (for example fifth) order. The thicknesses of the subelements of the second pair are so selected that the retardation produced jointly by those subelements is an odd-numbered multiple of half the working wavelength (for example 5*λ+λ/2=11/2*λ), that is to say form a 'lambda/2-plate' of higher (for example fifth) order. It will be appreciated that the retardation of lambda/2 is in each case here only by way of example and it is also possible to set another desired resulting retardation such as for example lambda/4, insofar as then the thicknesses of the subelements of the second pair are so selected that the retardation produced overall by those subelements is an odd-numbered multiple of a quarter working wavelength (that is to say for example 5*λ+λ/4=21/4*λ). That arrangement can be designed for a predetermined angle such that the retardation of the overall arrangement in situations 1 and 2 is the same, in which respect at the same time the temperature sensitivity of the arrangement (that is to say the variation in retardation with a change in temperature) is as low as in the case of a zero-order retardation element. A specific embodiment by way of example is set forth in Tables 13 and 14.

TABLE 13

| Subelement | Material | Thickness [µm] | Azimuth angle θ of the optical crystal axis [°] |
|---|---|---|---|
| 721 | Sapphire | 102.640 | 0 |
| 722 | Sapphire | 97.754 | 90 |
| 723 | Quartz | 64.046 | 90 |
| 724 | Quartz | 60.995 | 0 |

TABLE 14

| Tilt angle α [°] | Retardation [nm] situation 1 | Retardation [nm] situation 2 |
|---|---|---|
| 0 | 96.652 | 96.652 |
| 5 | 96.652 | 96.652 |
| 10 | 96.652 | 96.654 |
| 15 | 96.656 | 96.657 |
| 20 | 96.669 | 96.667 |

In the foregoing example of a higher-order retardation arrangement it is to be noted that the orientations of the optical crystal axes lie in the plane of the plate with a high level of accuracy (for example relative to a zero-order retardation element).

The disclosure is not limited to the retardation arrangements with plane-plates, shown in the foregoing embodiments. Rather the principle of the combination of subelements including optically uniaxial crystal materials of optically opposite character and either mutually perpendicular ('crossed') or parallel orientation of the optical crystal axis can also be applied to retardation arrangements involving a thickness profile varying over the cross-section, as are known in the form of polarisation-influencing optical elements for example from U.S. Pat. No. 6,252,712 B1. Polarisation-influencing optical elements of that kind are used for example to compensate for a disturbance in polarisation distribution, which is present in the projection objective.

Figure 8:
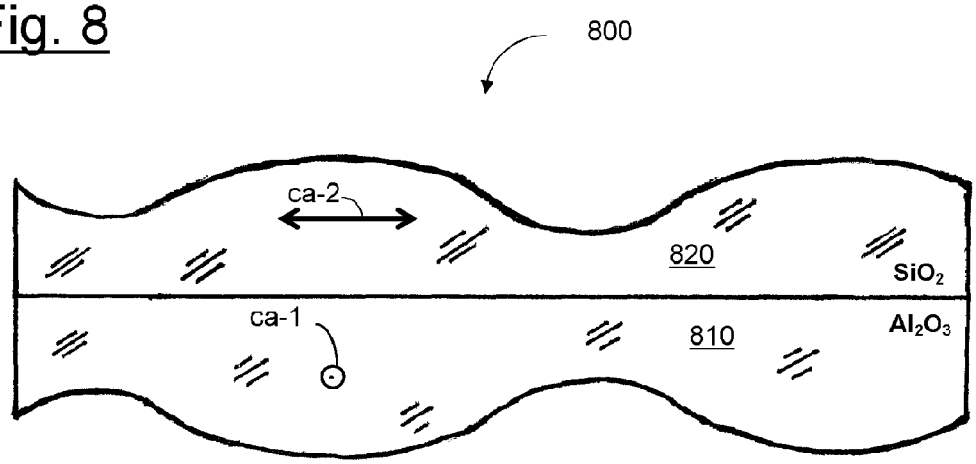

Now, in a projection objective, such a polarisation-influencing optical element with a thickness profile (shown in greatly exaggerated form) varying in the direction of the optical system axis is composed of at least two subelements of opposite optical character, as diagrammatically shown in FIG. 8 for a polarisation-influencing optical element 800. That element includes two subelements 810 and 820 whose optical crystal axes are identified by ca-1 and ca-2 respectively and are respectively oriented in the plane of the plate, crossing each other at an angle of 90°. Optically positive materials which are particularly suitable are crystalline quartz ($SiO_2$) and magnesium fluoride ($MgF_2$). Optically negative materials which are particularly suitable are sapphire ($Al_2O_3$) and lanthanum fluoride ($LaF_3$). The component dimensions can vary considerably depending on the respective position in a lithography objective and thus also depending on the respective angle loading, for example in the range of between 30 mm and 300 mm.

Figure 9:
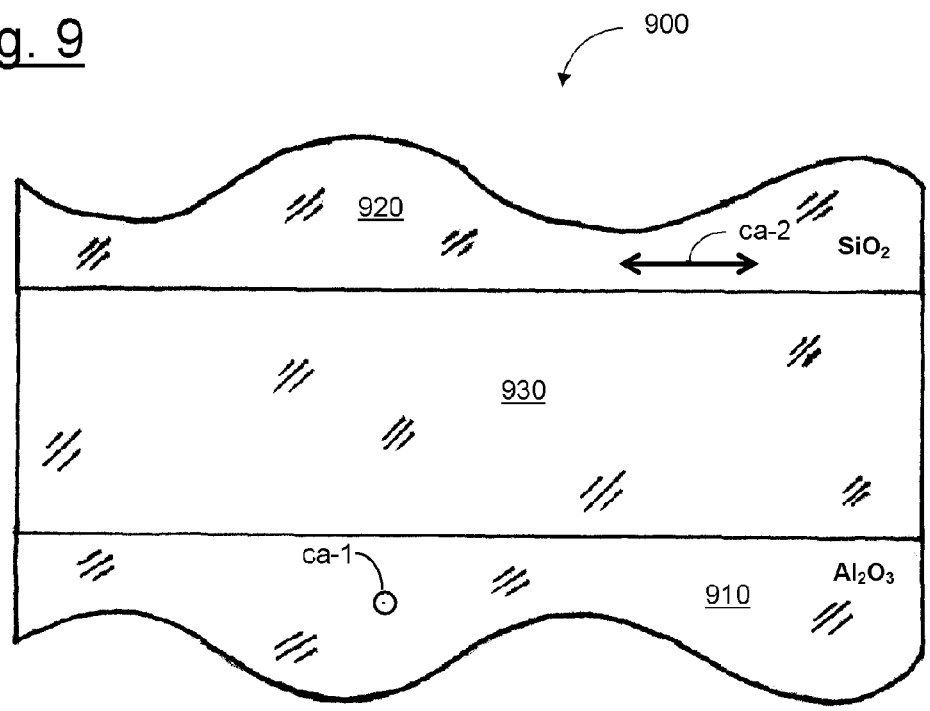

FIG. 9 shows a polarisation-influencing optical element 900 which includes two subelements 910 and 920, similarly to FIG. 8, wherein they are disposed on mutually opposite side surfaces of a carrier element 930 of optically isotropic material such as for example quartz glass. The thickness of the quartz glass carrier can vary for example approximately in a range of between 2 and 20 mm depending on the respective diameter. The thickness variation of the crystals can be for example in the range of between 0 and 10 µm.

The combination, as shown in FIGS. 8 and 9, of subelements 810, 820 and 910, 920 respectively of optically uniaxial crystal materials of opposite optical carrier, similarly to those hereinbefore in conjunction with the configuration of the subelements in the form of plane-plates, can provide for a substantial reduction in the dependency of retardation on the tilt direction and also in dependence on the tilt angle. Furthermore, similarly to the embodiment of Tables 10 and 11 described in conjunction with the configuration of the subelements in the form of plane-plates, for a predetermined angle loading the retardation can also be independent of the tilt direction. Furthermore it is also possible to set a desired configuration in respect of a variation in retardation by way of the azimuth angle and/or the tilt angle so that this effect is then added to the variation, caused by the above-described variation in thickness, in retardation in the direction perpendicular to the optical system axis or over the cross-section, perpendicular to the light propagation direction, of the polarisation-influencing optical element.

Figure 10:
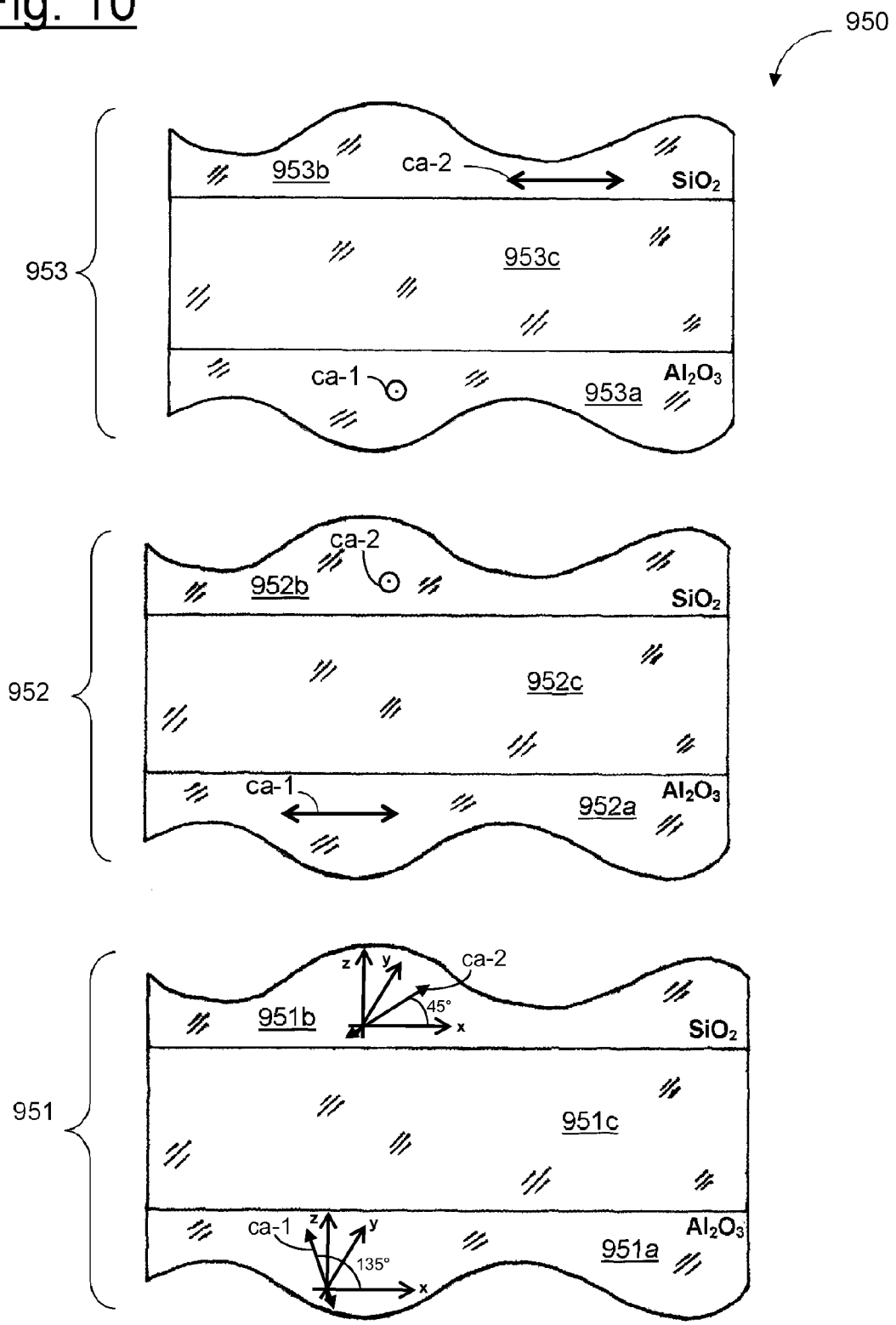

FIG. 10 diagrammatically shows an arrangement of three polarisation-influencing optical elements 951, 952 and 953 which are each of a structure corresponding to FIG. 9 and are composed of two respective subelements 951a-b, 952a-b and 953a-b, wherein their optical crystal axes identified by ca-1 and ca-2 respectively are respectively oriented in the plane of the plate and wherein the optical crystal axes ca-1 and ca-2 of the subelements associated with the same polarisation-influencing optical element 951, 952 and 953 respectively again cross each other at an angle of 90°. The third and second polarisation-influencing elements 953, 952 are in that case arranged in such a way that, in the subelements 953b and 952b of optically positively uniaxial material, the optical crystal axes ca-2 are oriented in mutually perpendicular relationship while in the subelements 953a and 952a of optically negatively uniaxial material, the optical crystal axes ca-1 are oriented in mutually perpendicular relationship. The first polarisation-influencing element 951 is so arranged that, in the subelement 951b of optically positively uniaxial material, the optical crystal axis ca-2 is oriented at an angle different from 0° and different from 90° (generally different from an integral multiple of 90°) relative to the respective optical crystal axes ca-2 of the elements 952b and 953b, wherein the optical crystal axis ca-1 in the subelement 951a of optically negatively uniaxial material is arranged perpendicularly to the optical crystal axis ca-2 of the subelement 951b. In the FIG. 10 embodiment, in the subelement 951b of optically positively uniaxial material, the optical crystal axis ca-2 is turned at an angle of 45° in the x-y-plane with respect to the x-axis (the z-axis extends in the direction of the respective element axes or in the light propagation direction) while the optical crystal axis ca-1 in the subelement 951a of optically negatively uniaxial material is turned at an angle of 135° in the x-y-plane with respect to the x-axis.

Via the arrangement 950, a suitable choice of the individual thickness profiles of the polarisation-influencing optical elements 951, 952 and 953 (or the thickness profiles of their subelements 951a-b, 952a-b and 953a-b) makes it basically possible to set any desired variation in retardation both in dependence on the tilt angle of the arrangement or the angle of incidence of the light passing therethrough and also in dependence on the positional co-ordinate in the direction perpendicular to the optical system axis or over the cross-section, perpendicular to the light propagation direction, of the polarisation-influencing optical element.

Similarly to the advantages already described in connection with the subelements being in the form of plane-plates, greater thicknesses of the subelements 951 through 953, for example in the range of between 50 and 500 μm, with a still acceptable angle dependency in respect of retardation, can be implemented with the arrangement 950 of FIG. 10 by the use of polarisation-influencing elements of higher order.

Figure 11:
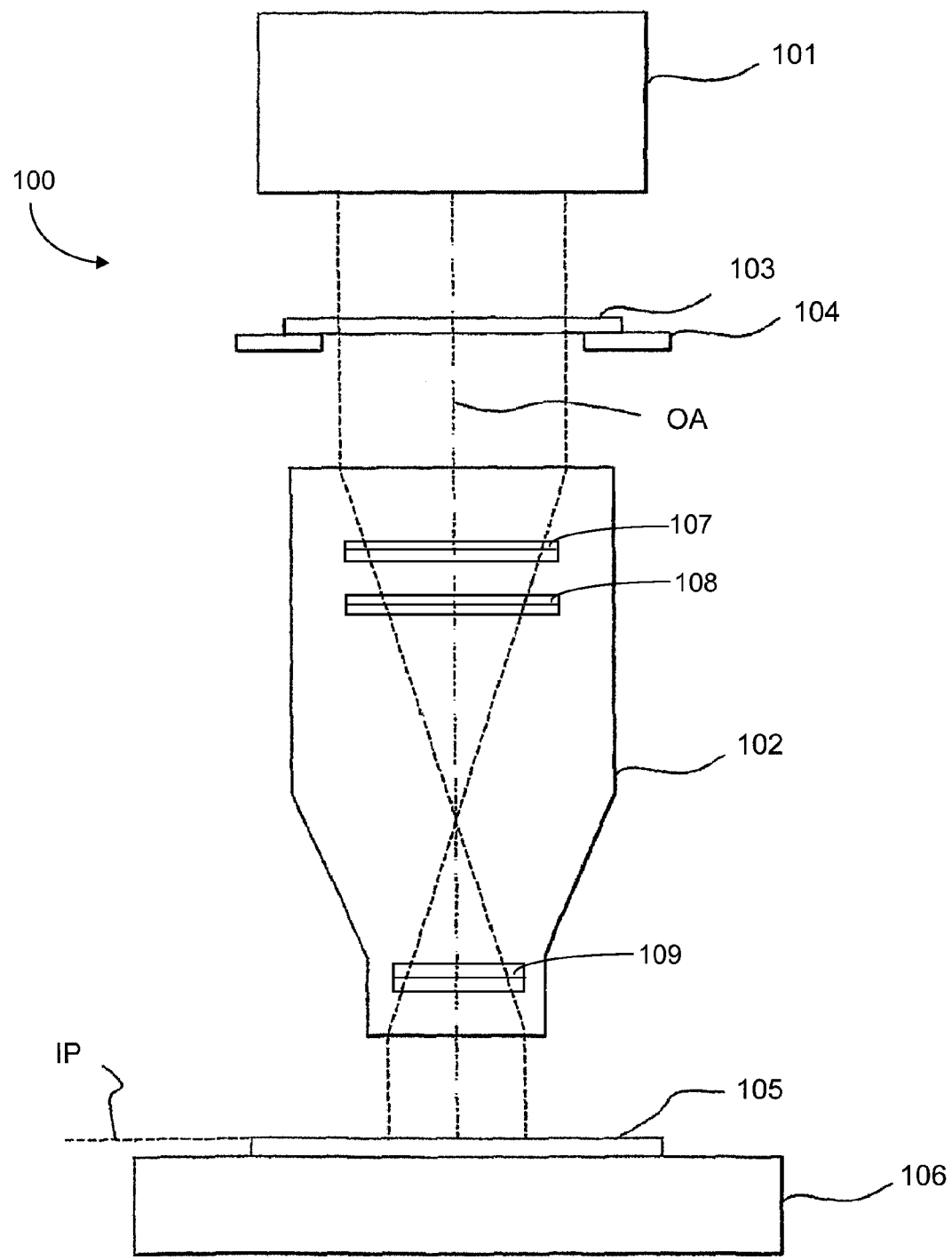
FIG. 11 shows a diagrammatic view of a microlithographic projection exposure apparatus in which there is provided a retardation arrangement.

Although the individual subelements of the arrangement 950 of FIG. 10 are shown in that Figure as directly following each other, the subelements when used in a projection objective can be arranged distributed over that projection objective, as is diagrammatically shown in FIG. 11. Via such an arrangement distributed over the projection objective it is possible to afford additional correction options in particular in the case of asymmetrical image fields.

FIG. 11 shows a diagrammatic view of the structure of a microlithographic projection exposure apparatus 100. The apparatus 100 has an illumination device 101 and a projection objective 102, wherein an optical axis OA is defined by the lens arrangement (not shown in detail) of the projection objective 100. Arranged between the illumination device 101 and the projection objective 102 is a mask 103 which is held in the beam path via a mask holder 104. The mask 103 has a structure in the micrometer through nanometer range, the image thereof being formed on an image plane IP on a reduced scale for example by a factor of 4 or 5, via the projection objective 102. A light-sensitive substrate 105, or a wafer, which is positioned by a substrate holder 106, is held in the image plane IP. The optical element which is closest to the image plane IP or the wafer can be for example a lens of intrinsically birefringent material, the IDB of which is compensated by the retardation arrangement.

Certain embodiments have been described, but numerous variations and alternative embodiments will be apparent to the man skilled in the art, for example by combination and/or exchange of features of individual embodiments. Accordingly it will be appreciated by the man skilled in the art that such variations and alternative embodiments are also embraced by the present disclosure and the scope of the disclosure is limited only in the sense of the accompanying claims and equivalents thereof.

The invention claimed is:

1. A projection exposure apparatus, comprising:
   a birefringent retardation arrangement comprising a retardation element, the retardation element comprising:
      a first subelement comprising an optically positively uniaxial crystal material which has a first optical crystal axis; and
      a second subelement comprising an optically negatively uniaxial crystal material which has a second optical crystal axis and which is arranged along an element axis of the retardation element before or after the first subelement,
   wherein:
      the first crystal axis and the second crystal axis are disposed in a plane perpendicular to an optical axis of the projection exposure apparatus;
      the first crystal axis and the second crystal axis are either arranged at an angle of 0° ±5° relative to each other or at an angle of 90° ±5° relative to each other; and
      the projection exposure apparatus is a microlithographic projection exposure apparatus.

2. A projection exposure apparatus as set forth in claim 1, wherein the first subelement and the second subelement are substantially in the form of plane-plates.

3. A projection exposure apparatus as set forth in claim 1, wherein the first subelement and/or the second subelement is of a thickness profile which varies transversely with respect to the optical axis of the projection exposure apparatus.

4. A projection exposure apparatus as set forth in claim 1, wherein the retardation element is of a rotationally symmetrical configuration relative to the element axis.

5. A projection exposure apparatus as set forth in claim 1, wherein the retardation element axis is parallel to the optical axis of the projection exposure apparatus.

6. A projection exposure apparatus as set forth in claim 1, wherein the first subelement and/or the second subelement is/are arranged on a carrier element of optically isotropic material.

7. A projection exposure apparatus as set forth in claim 1, wherein for light passing through in parallel relationship with the projection optical axis of the projection exposure apparatus, of a predetermined working wavelength, the retardation arrangement produces a retardation of $R=R_0+K*\lambda$, wherein K is at least 3.

8. A projection exposure apparatus as set forth in claim 1, wherein with a mutually parallel arrangement of the first and second crystal axis one of the two subelements whose crystal material has a greater mean refractive index than that of the other subelement causes a greater retardation for light passing through the retardation element along the element axis than the other subelement.

9. A projection exposure apparatus as set forth in claim 1, wherein the arrangement further comprises a second retardation element arranged relative to the first retardation element so that the optical crystal axes of the subelements of optically positively uniaxial material are respectively oriented in mutually perpendicular relationship and the optical crystal axes of the subelements of optically negatively uniaxial material are respectively oriented in mutually perpendicular relationship.

10. A projection exposure apparatus as set forth in claim 9, wherein the arrangement further comprises at least one third retardation element arranged relative to the first and second retardation elements so that in a subelement of optically positively uniaxial material of the third retardation element the optical crystal axis is oriented at an angle different from an integral multiple of 90° relative to the respective optical crystal axes of the subelements of optically positively uniaxial material in the first and second retardation elements.

11. A projection exposure apparatus as set forth in claim 9, wherein the retardation elements are arranged in immediately following relationship along the optical axis of the projection exposure apparatus.

12. A projection exposure apparatus as set forth in claim 11, wherein the respective mutually following retardation elements are arranged in direct contact with each other.

13. A projection exposure apparatus as set forth in claim 1, wherein the optically positively uniaxial crystal material is selected from the group consisting of crystalline quartz ($SiO_2$) and magnesium fluoride ($MgF_2$).

14. A projection exposure apparatus as set forth in claim 1, wherein the optically negatively uniaxial crystal material is selected from the group consisting of sapphire ($Al_2O_3$) and lanthanum fluoride ($LaF_3$).

15. An arrangement, comprising:
   a retardation element, the retardation element comprising:
      a first subelement comprising an optically positively uniaxial crystal material which has a first optical crystal axis; and
      a second subelement comprising an optically negatively uniaxial crystal material which has a second optical crystal axis and which is arranged along an element axis of the retardation element before or after the first subelement;

wherein:

the first crystal axis and the second crystal axis are respectively disposed in a plane perpendicular to an optical axis of the arrangement;

The first crystal axis and the second crystal axis are either arranged at an angle of 0° ±5° relative to each other or at an angle of 90° ±5° relative to each other;

the first subelement and/or the second subelement have a thickness profile varying transversely with respect to the optical system axis; and the arrangement is a birefringent retardation arrangement.

16. An arrangement, comprising:

a retardation element, the retardation element comprising:

a first subelement comprising an optically positively uniaxial crystal material which has a first optical crystal axis; and a second subelement comprising an optically negatively uniaxial crystal material which has a second optical crystal axis and which is arranged along an element axis of the retardation element before or after the first subelement;

wherein:

the first crystal axis and the second crystal axis are respectively disposed in a plane perpendicular to an optical axis of the arrangement;

the first crystal axis and the second crystal axis are either arranged at an angle of 0° ±5° relative to each other or at an angle of 90° ±5° relative to each other;

the optically negatively uniaxial crystal material is selected from the group consisting of sapphire ($Al_2O_3$) and lanthanum fluoride ($LaF_3$); and the arrangement is a birefringent retardation arrangement.

17. An arrangement, comprising:

a retardation element, the retardation element comprising:

a first subelement comprising an optically positively uniaxial crystal material which has a first optical crystal axis; and a second subelement comprising an optically negatively uniaxial crystal material which has a second optical crystal axis and which is arranged along an element axis of the retardation element before or after the first subelement;

wherein:

the first crystal axis and the second crystal axis are respectively disposed in a plane perpendicular to an optical axis of the arrangement;

the first crystal axis and the second crystal axis are either arranged at an angle of 0° ±5° relative to each other or at an angle of 90° ±5° relative to each other;

wherein the optically positively uniaxial crystal material comprises magnesium fluoride ($MgF_2$); and the arrangement is a birefringent retardation arrangement.

18. An apparatus, comprising:

an illumination device; and a projection objective, wherein the illumination device and/or the projection objective comprises a retardation arrangement as set forth in claim 15, and the apparatus is a microlithographic projection exposure apparatus.

19. A process, comprising:

using the projection exposure apparatus as set forth in claim 18 to provide a microstructured component.

20. The process of claim 19, wherein the process comprises:

providing a substrate to which a layer of a light-sensitive material is at least partially applied;

providing a mask having structures to be reproduced; and projecting at least as part of the mask on to a region of the layer using the projection exposure apparatus.

* * * * *

UNITED STATES PATENT AND TRADEMARK OFFICE
CERTIFICATE OF CORRECTION

PATENT NO. : 8,023,104 B2  
APPLICATION NO. : 11/971659  
DATED : September 20, 2011  
INVENTOR(S) : Karl-Heinz Schuster Page 1 of 1

It is certified that error appears in the above-identified patent and that said Letters Patent is hereby corrected as shown below:

Drawing Sheet 3 of 9 (X axis; Fig. 6),
Line 1, Delete "Saphirre" and insert --Sapphire--

Column 1,
Line 58, Delete "of of" and insert --of--

Column 2,
Line 54, Delete "birefingent" and insert --birefringent--

Column 12,
Line 2, Delete "[nm}" and insert --[nm]--

Signed and Sealed this
Eighth Day of November, 2011

David J. Kappos
*Director of the United States Patent and Trademark Office*